(12) United States Patent
McClure

(10) Patent No.: US 7,368,947 B2
(45) Date of Patent: May 6, 2008

(54) VOLTAGE TRANSLATING CONTROL STRUCTURE

(75) Inventor: David Charles McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 217 days.

(21) Appl. No.: 11/012,533

(22) Filed: Dec. 15, 2004

(65) Prior Publication Data

US 2005/0134356 A1  Jun. 23, 2005

Related U.S. Application Data

(60) Provisional application No. 60/530,576, filed on Dec. 18, 2003.

(51) Int. Cl.
*H03K 19/094* (2006.01)
*H03K 19/0175* (2006.01)

(52) U.S. Cl. .............................. 326/68; 326/80; 326/81
(58) Field of Classification Search .................. 326/68, 326/81; 327/333
See application file for complete search history.

(56) References Cited

U.S. PATENT DOCUMENTS 6,377,106 B1 * 4/2002 Rozsypal .................... 327/333
7,117,373 B1 * 10/2006 Trimberger et al. ........ 713/193

* cited by examiner

*Primary Examiner*—Anh Q. Tran
(74) *Attorney, Agent, or Firm*—Lisa K. Jorgenson; Renee Michelle Leveque

(57) ABSTRACT

A voltage translating control structure for switching logic is described. A battery drain problem is corrected by this structure. The voltage translating feature allows reliable switching between power supply and battery even if the power supply voltage has significantly decreased. Operation is adaptable to include all DC power systems. Logic circuitry that also allows voltage translation is presented.

4 Claims, 5 Drawing Sheets

VOLTAGE TRANSLATING CONTROL STRUCTURE

PRIORITY CLAIM

This application claims priority from the provisional U.S. patent application titled "Multiple Supply Level Logic for Battery", filed Dec. 18, 2003 and identified by Application No. 60/530,576, which is hereby incorporated herein by reference.

BACKGROUND

Supervisory circuits are used to monitor power supply voltages and switch to or from a backup power source depending on the acceptability of the monitored voltage. Supervisory circuits are used in microprocessors, digital equipment, and various other electronic equipment and systems. A supervisory circuit commonly contains a switching circuit that is used to switch the load between power derived from the power supply and power derived from a battery, and back again. This switching circuit must furnish a high degree of isolation between switched power sources, so that for example the battery is not loaded by any part of the power supply circuitry when running off the battery. Circuit elements that may provide inadequate isolation during low power supply voltage conditions are the main switching circuit and other functional elements such as logic gates.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
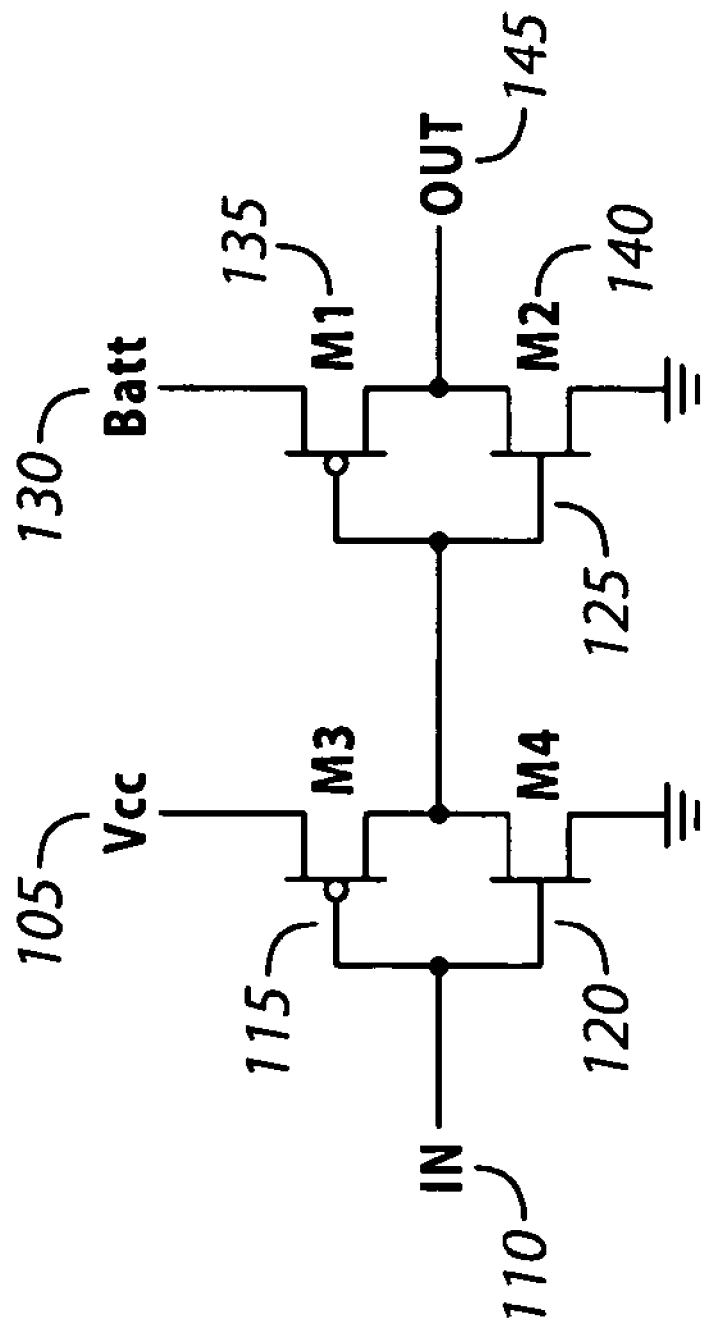
FIG. 1 is an exemplary simplified schematic diagram of a switching circuit.

A structure for providing high isolation between a power supply and a battery, when the battery is supplying primary power to the load is presented, in accordance with certain embodiments of the present invention. As used herein, battery may refer to a battery reference voltage or another other applicable secondary voltage.

Many variations, equivalents and permutations of these illustrative exemplary embodiments of the invention will occur to those skilled in the art upon consideration of the description that follows. The particular examples utilized should not be considered to define the scope of the invention. For example discrete circuitry implementations and integrated circuit implementations, and hybrid approaches thereof, may be formulated using techniques of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

For purposes of this document, the exact mechanical and electrical parameters of equipments are unimportant to an understanding of the invention, and many different types of electrical and mechanical components may be utilized without departing from the spirit and scope of the invention. An example is that components utilized in the circuit may differ as to value, power rating, and physical size. This document uses generalized descriptions by way of example only. Many variations for these constituent items are possible without departing from the spirit and scope of the invention.

Refer to FIG. 1, which is an exemplary simplified schematic diagram of a switching circuit. Transistor 135 and transistor 140 connect Out 145 to Batt 130 if gate 125 is low, and connect Out 145 to ground if gate 125 is high. Gate 125 is controlled by a switch consisting of transistor 115 and transistor 120, these transistors being controlled by In 110. If In 110 is low, gate 125 will be high, or at Vcc 105 potential. If In 110 is high, gate 125 will be at ground potential. The problem occurs when In 110 is low, connecting gate 125 to Vcc 105, and Vcc 105 is also a reduced value. When Vcc 105 is lower than approximately 2.4 VDC, gate 125 will also be lower than 2.4 VDC, and Out 145 will be connected to Batt 130 even though Batt 130 is supposed to be disconnected. This will result in Batt 130 being drained when it is supposed to be disconnected.

Figure 2:
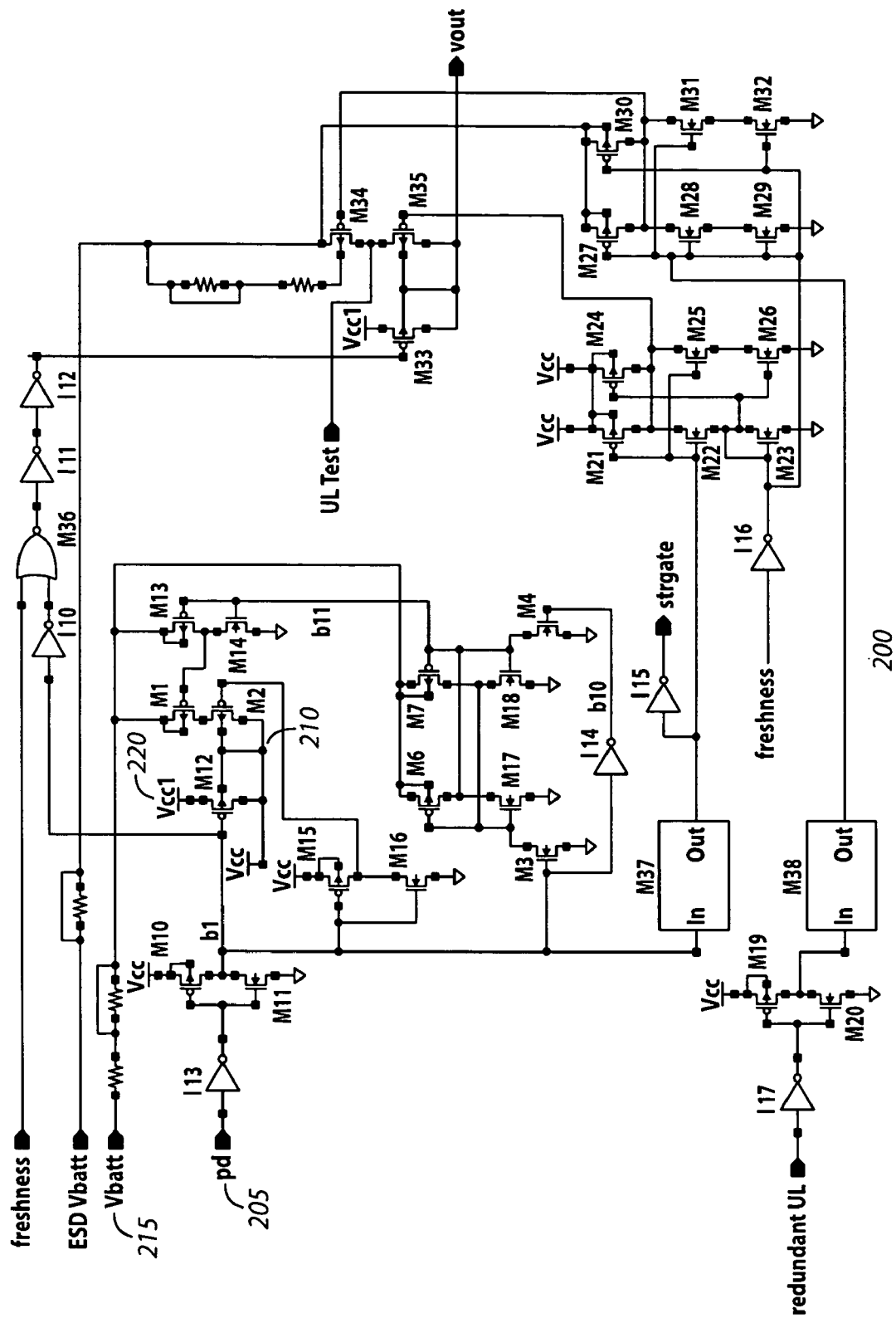
FIG. 2 is an exemplary simplified schematic diagram of a switching circuit, utilized in accordance with certain embodiments of the present invention.

Refer to FIG. 2, which is an exemplary simplified schematic diagram of a switching circuit, a voltage translating control structure, utilized in accordance with certain embodiments of the present invention. Vbatt 215 is voltage from a backup battery source. Pd 205 is a logic input that controls if Vbatt 215 or a power supply Vcc1 220 is applied to switched buss Vcc 210. This circuit was utilized as part of an apparatus employed to test and validate the concepts and performance of the present invention. The specific circuit design will not be discussed here as it is not necessary to an understanding of the present invention.

Figure 3:
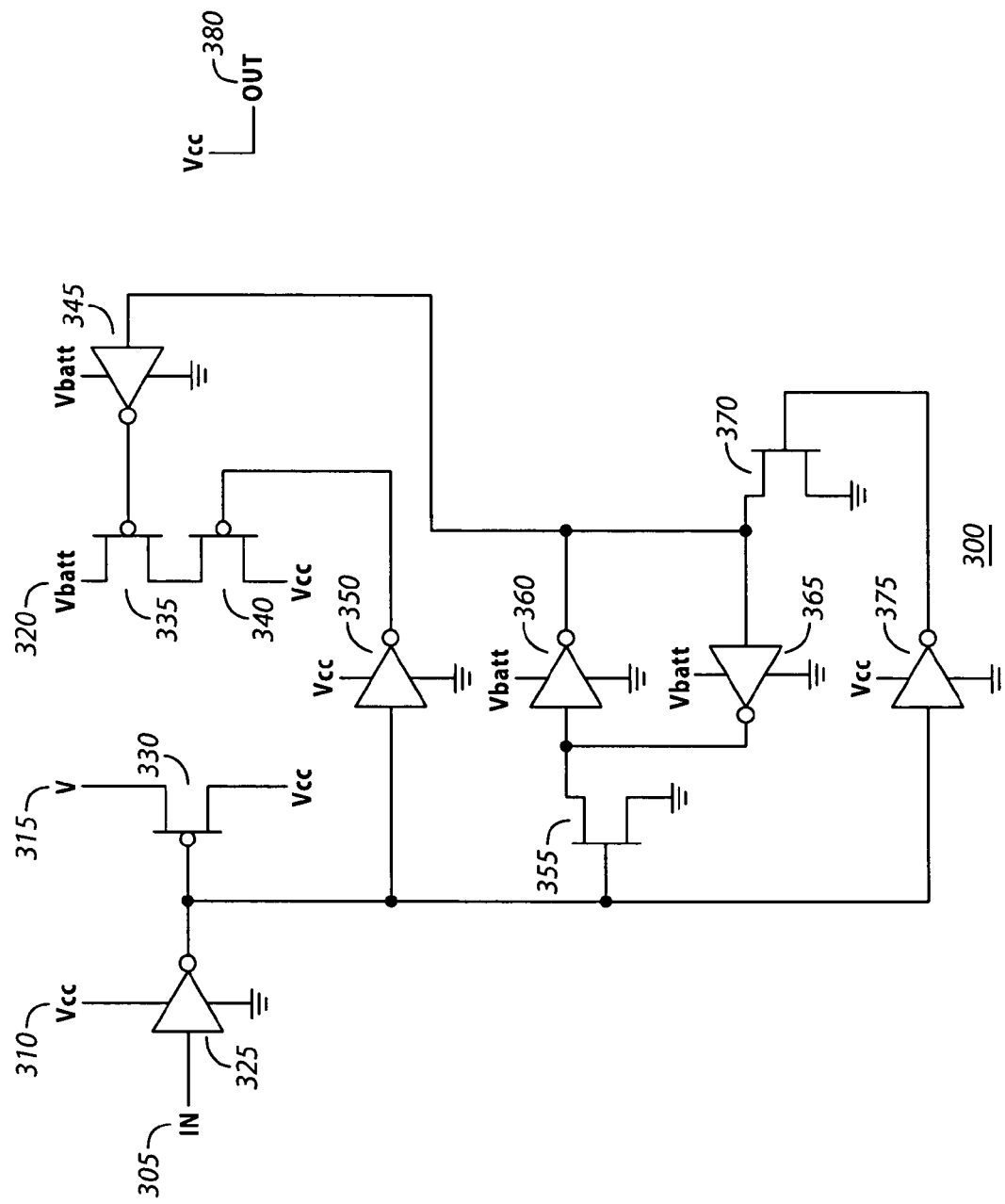
FIG. 3 is a simplified schematic diagram of a switching circuit, utilized in accordance with certain embodiments of the present invention.

Refer to FIG. 3, which is a simplified schematic diagram of a voltage translating control structure, here a switching circuit, utilized in accordance with certain embodiments of the present invention. IN 305 is a digital logic input, with a high level indicating that the switched power buss Vcc 310 is to be connected to V 315, and a low level indicating that switched power buss Vcc 310 is to be connected to battery voltage Vbatt 320. The output of the circuit is OUT 380 which is Vcc 310. If IN 305 is high, the output of inverter 325 is low. This will turn transistor 330 on and connect V 315 to Vcc 310. The low output of inverter 325 is coupled to the input of inverter 350. The output of inverter 350 is therefore high, and this will turn transistor 340 off. Transistor 340 and transistor 335 are switches in series, and when both are turned on the battery Vbatt 320 will be connected to switched power buss Vcc 310. Note that if IN 305 is high, transistor 330 is turned on, which connects V 315 to Vcc 310, and transistor 340 is turned off which prevents Vbatt 320 from being connected to Vcc 310. With IN 305 high, the low output of inverter 325 turns off transistor 355 and produces a high at the output of inverter 375. The high output of inverter 375 turns transistor 370 on, thus producing a low at the input of inverter 365. The output of inverter 365 is therefore high, and is the input to inverter 360. Because of this the output of inverter 360 is low. The low output of inverter 360 is applied to the input of inverter 345, and the output of inverter 345 is high and is applied to the gate of transistor 335. Note that for IN 305 being high, meaning that V 315 is supposed to be connected to Vcc 310 and Vbatt 320 is not supposed to be connected to Vcc 310, that transistor 330 is turned on and that transistor 340 and transistor 335 are turned off.

IN 305 is the digital logic input, with a low level indicating that the switched power buss Vcc 310 is to be connected to Vbatt 310. The output of the circuit is OUT 380 which is Vcc 310. If IN 305 is low, the output of inverter 325 is high. This will turn transistor 330 off and disconnect V 315 from Vcc 310. The high output of inverter 325 is coupled to the input of inverter 350. The output of inverter 350 is therefore low, and this will turn transistor 340 on. Transistor 340 and transistor 335 are switches in series, and when both are turned on the battery Vbatt 320 will be connected to switched power buss Vcc 310. Note that if IN 305 is low transistor 330 is turned off, which will not allow connection between V 315 and Vcc 310, and transistor 340 is turned on. With IN 305 low, the high output of inverter 325 turns on transistor 355 and produces a low at the output of inverter 375. The low output of inverter 375 turns transistor 370 off, thus producing a high at the input of inverter 365. The output of inverter 365 is therefore low, and is the input to inverter 360. Because of this the output of inverter 360 is high. The high output of inverter 360 is applied to the input of inverter 345, and the output of inverter 345 is low and is applied to the gate of transistor 335. Note that for IN 305 being low, meaning that Vbatt 320 is supposed to be connected to Vcc 310 and V 315 is not supposed to be connected to Vcc 310, that transistor 330 is turned off and that transistor 340 and transistor 335 are both turned on which completes the circuit between Vbatt 320 and Vcc 310.

Note that the inputs of inverters 365, inverter 360, and inverter 345 which may contain p-channel gates are not referenced to Vcc and ground. Because of this the outputs of these inverters will not be responsive to variations in the supply voltage V 315. The gate of transistor 335 will not vary as supply voltage V 315 varies, and the original battery drain problem described in the discussion of FIG. 1 is solved by this level translation circuit. AND/NAND and OR/NOR gates may also be used in place of inverter 365, inverter 360, and inverter 345 as required to meet system requirements, and the gate inputs may be coupled together or used separately. It should also be noted that this level translating design is capable of operation in very low power applications.

Refer to FIGS. 4A-4D, which are simplified schematic diagrams of logic voltage translation circuits, in accordance with certain embodiments of the present invention. There are two embodiments of AND/NAND circuits and two embodiments of OR/NOR circuits. These logic functions are achieved using level translating circuitry which allows their inclusion in alternate or related circuitry for the present invention and other general uses.

Figure 4B:
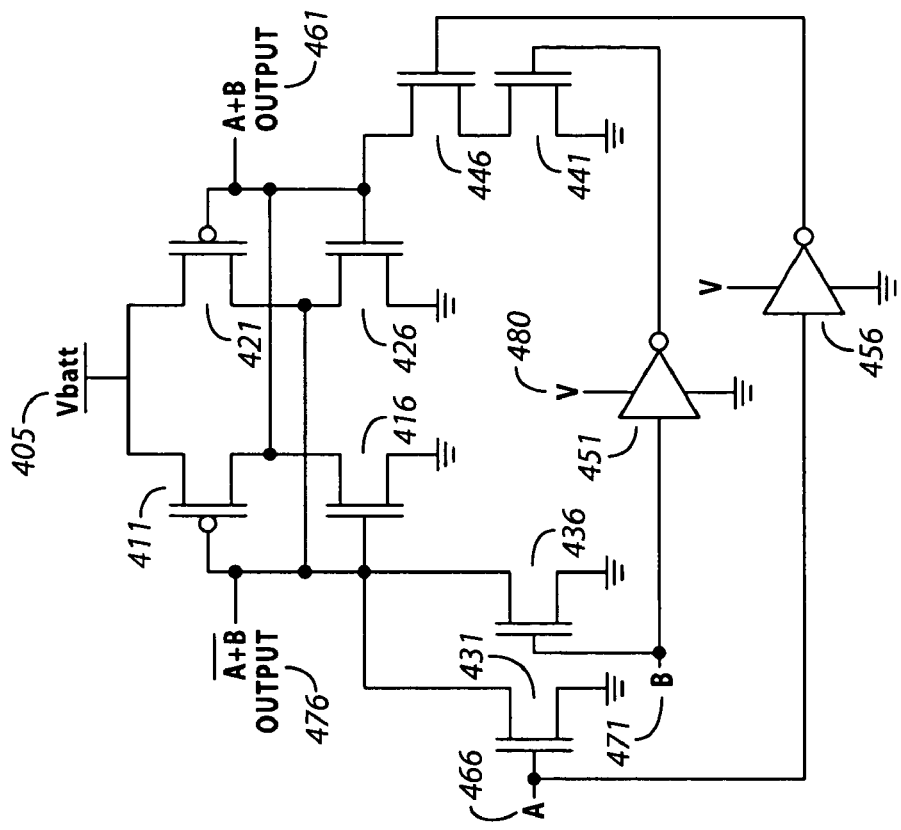
FIGS. 4A-4D are simplified schematic diagrams of logic voltage translation circuits, in accordance with certain embodiments of the present invention.
Figure 4A:
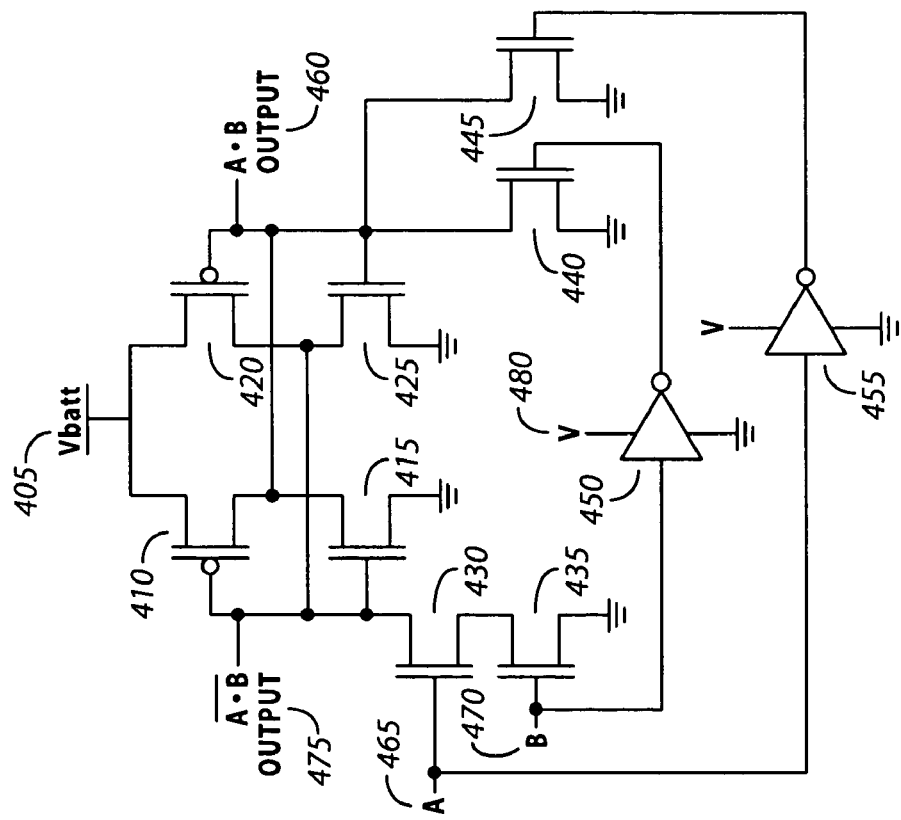

FIG. 4A depicts a voltage translating AND/NAND circuit. The two supply voltages are Vbatt 405 and V 480. Inputs A 465 and B 470 are referenced to the V 480 supply. Output 475 and output 460 are referenced to the Vbatt 405 supply. If input A 465 is low, transistor 430 will be in the off condition and inverter 455 will force transistor 445 to the on condition. If input A is high, transistor 430 will be in the on condition and inverter 455 will force transistor 445 to the off condition. If input B 470 is low, transistor 435 will be in the off condition and inverter 450 will force transistor 440 to the on condition. If input B 470 is high, transistor 435 will be in the on condition and inverter 450 will force transistor 440 to the off condition. If either transistor 440 or transistor 445 and in the on condition, output 460 is pulled low. If output 460 is low, transistor 425 is turned off and transistor 420 is turned on. If transistor 420 is turned on, Vbatt will be applied to output 475, which will turn transistor 410 off and transistor 415 on. If transistor 415 is turned on, output 460 is maintained in the low condition. Transistor 430 and transistor 435 are in the off condition because either A 465 or B 470, or both, are low. If input A 465 and B 470 are both high, transistor 430 and transistor 435 are both on which will force output 475 low. Additionally, inverter 450 will force transistor 440 off and inverter 455 will force transistor 445 off. If output 475 is low, transistor 415 is off and transistor 410 is on. If transistor 410 is on, Vbatt 405 is applied to output 460, making it high. It can thus be seen that the only condition which will force output 460 to a high condition (and output 475 to a low condition) is if both A 465 and B 470 are high.

FIG. 4B depicts a voltage translating OR/NOR circuit. The two supply voltages are Vbatt 405 and V 480. Inputs A 466 and B 471 are referenced to the V 480 supply. Output 476 and output 461 are referenced to the Vbatt 405 supply. If input A 466 is low, transistor 431 will be in the off condition and inverter 456 will force transistor 446 to the on condition. If input A 466 is high, transistor 431 will be in the on condition and inverter 456 will force transistor 446 to the off condition. If input B 471 is low, transistor 436 will be in the off condition and inverter 451 will force transistor 441 to the on condition. If input B 471 is high, transistor 436 will be in the on condition and inverter 451 will force transistor 441 to the off condition. If both transistor 441 and transistor 446 are in the on condition, output 461 is pulled low. If output 461 is low, transistor 426 is turned off and transistor 421 is turned on. If transistor 421 is turned on, Vbatt will be applied to output 476, which will turn transistor 411 off and transistor 416 on. If transistor 416 is turned on, output 461 is maintained in the low condition. Transistor 431 and transistor 436 are in the on condition only when both A 466 and B 471 are low. If input A 466 or B 471 is either high, transistor 431 or transistor 436 or both are on which will force output 476 low. Additionally, under this condition inverter 451 will force transistor 441 off and inverter 456 will force transistor 446 off. If output 476 is low, transistor 416 is off and transistor 411 is on. If transistor 411 is on, Vbatt 405 is applied to output 461, making it high. It can thus be seen that the only condition which will force output 461 to a low condition (and output 476 to a high condition) is if both A 466 and B 471 are low.

Figures 4C, 4D:
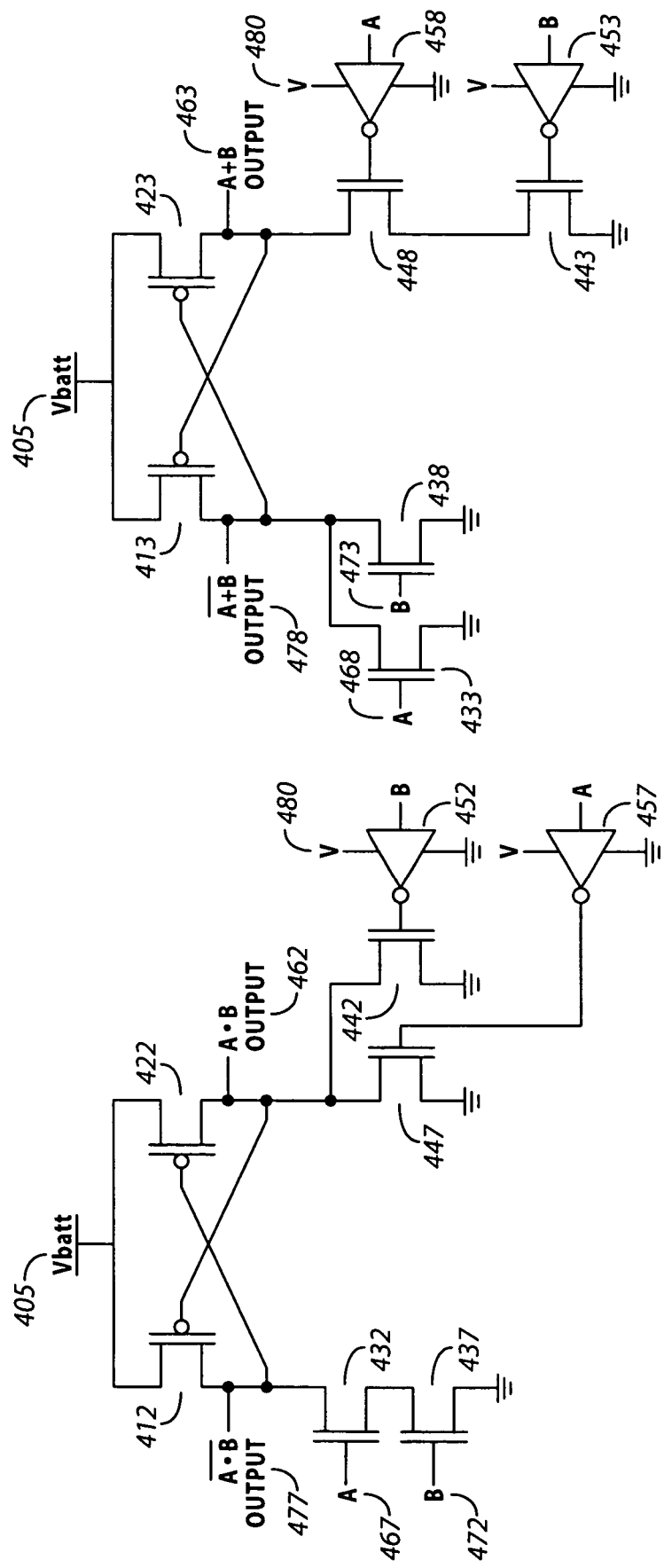

FIG. 4C depicts an alternate voltage translating AND/NAND circuit. The two supply voltages are Vbatt 405 and V 480. Inputs A 467 and B 472 are referenced to the V 480 supply. Output 477 and output 462 are referenced the Vbatt 405 supply. If input A 467 is low, transistor 432 will be in the off condition and inverter 457 will force transistor 447 to the on condition. If input A 467 is high, transistor 432 will be in the on condition and inverter 457 will force transistor 447 to the off condition. If input B 472 is low, transistor 437 will be in the off condition and inverter 452 will force transistor 442 to the on condition. If input B 472 is high, transistor 437 will be in the on condition and inverter 452 will force transistor 442 to the off condition. If either transistor 442 or transistor 447 and in the on condition, output 462 is pulled low. If output 462 is low, transistor 412 is turned on. If transistor 412 is turned on, Vbatt will be applied to output 477, which will turn transistor 422 off and output 462 is maintained in the low condition. Transistor 432 or transistor 437 is in the off condition because either A 467 or B 472, or both, are low. If input A 467 and B 472 are both high, transistor 432 and transistor 437 are both on which will force output 477 low. Additionally, inverter 452 will force transistor 442 off and inverter 457 will force transistor 447 off. If output 477 is low, transistor 412 is off and transistor 422 is on. If transistor 412 is on, Vbatt 405 is applied to output 477, making it high. It can thus be seen that the only condition which will force output 462 to a high condition (and output 477 to a low condition) is if both A 467 and B 472 are high.

FIG. 4D depicts a voltage translating OR/NOR circuit. The two supply voltages are Vbatt 405 and V 480. Inputs A 468 and B 473 are referenced to the V 480 supply. Output 478 and output 463 are referenced to the Vbatt 405 supply. If input A 468 is low, transistor 433 will be in the off condition and inverter 458 will force transistor 448 to the on condition. If input A 468 is high, transistor 433 will be in the on condition and inverter 458 will force transistor 448 to the off condition. If input B 473 is low, transistor 438 will be in the off condition and inverter 453 will force transistor 443 to the on condition. If input B 473 is high, transistor 438 will be in the on condition and inverter 453 will force transistor 443 to the off condition. If both transistor 443 and transistor 448 are in the on condition, output 463 is pulled low. If output 463 is low, transistor 413 is turned on. If transistor 413 is turned on, Vbatt will be applied to output 478, which will turn transistor 423 off. Output 463 is thus maintained in the low condition. Transistor 433 or transistor 438 is in the on condition only when A 468 or B 473, or both, are high. If input A 468 or B 473 is either high, transistor 433 or transistor 438 or both are on which will force output 478 low. Additionally, under this condition inverter 453 will force transistor 443 and/or inverter 458 will force transistor 448 off. If output 478 is low, transistor 423 is on. If transistor 423 is on, Vbatt 405 is applied to output 463, making it high. It can thus be seen that the only condition which will force output 463 to a low condition (and output 478 to a high condition) is if both A 468 and B 473 are low.

Those of ordinary skill in the art will appreciate that many other circuit and system configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, other types of devices and circuits may be utilized for any component or circuit as long as they provide the requisite functionality. A further example is that the described structure may be implemented as part of an integrated circuit, or a hybrid circuit, or a discrete circuit, or combinations thereof. Yet another example is that the features of the present invention may be adapted to all DC power systems regardless of voltages. Accordingly, it is intended that the present invention embrace all such alternatives, modifications and variations as fall within the scope of the appended claims.

What is claimed is:

1. A voltage translating control structure operable to control switching
    from a primary voltage reference to a battery voltage reference with no drain on the battery voltage reference, comprising:
    a transistor operable to enable switching to the battery voltage reference; and
    a level translating structure to control the transistor; and
    wherein the level translating structure is operable to present to the control terminal of the transistor only those signals which are referenced to the battery voltage reference.

2. The voltage translating control structure of claim 1, wherein:
    the level translating structure accepts a plurality of logic inputs with each logic input referenced to either the primary voltage reference or to the battery voltage reference.

3. The voltage translating control structure of claim 1, further comprising:
    a plurality of inverters coupled in a feedback arrangement of the level translating structure translate binary input switch states to output states referenced to the battery voltage reference.

4. The voltage translating control structure of claim 1, further comprising:
    a plurality of transistors are utilized to couple logic inputs at the input of the voltage translating control structure to circuitry of the voltage translating control structure.

* * * * *